United States Patent [19]

Potter

[11] Patent Number: 5,650,729
[45] Date of Patent: Jul. 22, 1997

[54] CONDUCTIVE STRIP DETECTOR

[75] Inventor: Michael Potter, Hampshire, United Kingdom

[73] Assignee: De La Rue Systems Limited, United Kingdom

[21] Appl. No.: 139,101

[22] Filed: Oct. 18, 1993

[30] Foreign Application Priority Data

Oct. 19, 1992 [GB] United Kingdom ............... 9221926

[51] Int. Cl.⁶ .................................................. G01R 27/26
[52] U.S. Cl. ..................... 324/660; 324/681; 324/687; 324/690
[58] Field of Search ........................ 324/660, 661, 324/688, 690, 681, 687; 194/206

[56] References Cited

U.S. PATENT DOCUMENTS

| | | | |
|---|---|---|---|
| 3,048,775 | 8/1962 | Culbert | 224/687 |
| 3,428,889 | 2/1969 | Mayer | 324/681 |
| 3,572,566 | 3/1971 | Fraser | 324/690 |
| 3,626,287 | 12/1971 | DiNiro | 324/688 |
| 3,805,150 | 4/1974 | Abbe | 324/688 |
| 4,008,433 | 2/1977 | Fasser er al. | 361/280 |
| 4,063,167 | 12/1977 | Duly | 324/688 |
| 4,067,225 | 1/1978 | Dorman et al. | 324/688 |
| 4,311,959 | 1/1982 | Riessland et al. | 324/688 |
| 4,958,129 | 9/1990 | Poduje et al. | 324/661 |
| 5,122,754 | 6/1992 | Gotaas | 324/676 |
| 5,134,379 | 7/1992 | Maher et al. | 324/690 |
| 5,166,679 | 11/1992 | Vranish | 324/687 |
| 5,270,664 | 12/1993 | McMurthy | 324/687 |
| 5,417,316 | 5/1995 | Harbaugh | 324/672 |
| 5,419,424 | 5/1995 | Harbaugh | 324/663 |
| 5,436,565 | 7/1995 | Gammell | 324/688 |
| 5,442,347 | 8/1995 | Vranish | 324/687 |

FOREIGN PATENT DOCUMENTS

| | | |
|---|---|---|
| 0148771 | 1/1985 | European Pat. Off. . |
| 0175362 | 9/1985 | European Pat. Off. . |
| 03027227 | 4/1988 | European Pat. Off. . |
| 2166865 | 10/1985 | United Kingdom . |
| 2211976 | 10/1988 | United Kingdom . |

*Primary Examiner*—Kenneth A. Wieder
*Assistant Examiner*—Diep Do
*Attorney, Agent, or Firm*—Ostrolenk, Faber, Gerb & Soffen, LLP

[57] ABSTRACT

A conductive strip detector comprises a capacitor defined by an elongate, electrically conductive element (5) and a laterally spaced, electrically conductive member (1). Monitoring circuitry (15,16) monitors changes in the capacitance of the capacitor when an electrically conductive strip substantially parallel with the element is passed by the capacitor and indicates when a change in capacitance is due to the presence of an electrically conductive strip.

22 Claims, 3 Drawing Sheets

CONDUCTIVE STRIP DETECTOR

FIELD OF THE INVENTION

The invention relates to a detector for detecting the presence of an electrically conductive, typically metallic, or metallised plastic strip, such as the metal thread as found in paper currency or other security documents.

DESCRIPTION OF THE PRIOR ART

Metallic strip detectors are frequently used in systems which determine the genuineness of a document. Paper made with a metal thread is difficult to obtain, and so most counterfeit documents are made using unthreaded paper.

Metal thread detectors have been used for many years, as described in documents GB-A-017996, U.S. Pat. No. 4,536,709, and GB-A-2211976. The detectors described in the first two documents make use of a coil through which high frequency alternating current is driven, the metal thread passing close to the coil in use. The current though the coil generates a high frequency AC magnetic field which causes eddy currents to flow in the metal thread and the effect of these eddy currents is measured by the same coil (in GB-A-2017996) or a second receiving coil (in U.S. Pat. No. 4,536,709).

Such detectors have a number of disadvantages:

1. They require the use of specially made coils, which are expensive to manufacture.
2. The coils are generally fairly large. The area of the document presented to the detector is correspondingly large, and so the detector requires a relatively large length of the document transport.
3. The coils cannot be electromagnetically shielded, as any shield would necessarily be conductive, and so eddy currents would flow in the shield, masking the effects of the eddy currents in the metal thread. The detectors are therefore sensitive to large conducting objects anywhere near the coils, not just at the position where the metal thread normally appears.
4. The lack of electromagnetic shielding allows relatively large electromagnetic fields to be radiated by the coils: these fields can interfere with other, nearby electronic equipment.

The detectors described in the third document (GB-A-2211976) are of two types. The first type detects the passage of an electric current along a metal thread. In order for the current to pass through the paper into the thread, and to jump the small air gaps caused by inevitable breaks in the thread, it is necessary to use very high voltages (up to 6000 volts is suggested). The use of such high voltages has a number of practical disadvantages, including;

1. A high voltage generator is required—these are mechanically or electrically complex and are often relatively large
2. Special electrical insulation techniques must be used to ensure that such apparatus presents no hazard to the user.
3. The high electric fields attract dust, which may adversely affect the operation of the detector, and of any other optical systems in its vicinity.
4. The high electric fields, and the "sparking" which occurs at breaks in the thread, cause large radiated electromagnetic fields which can interfere with other, nearby electronic equipment.
5. Moist air conducts electric currents more easily than dry air, and so the leakage currents within the detector, and thus its performance, will depend on the humidity of the surrounding air.

The second type of detector described in GB-A-2211976 is based on the modulation of the capacitance of a sensing structure by the presence of a metal thread, but the embodiments described require either that the "plates" of the sensing structure be placed on either side of the thread (as shown in FIG. 2), or that complex designs of plates or rollers be used (FIGS. 3, 4 and accompanying text). The ingenious use of a gas discharge lamp to allow detection of the passage of an electric current also necessitates the use of high voltages (at least several hundred volts).

SUMMARY OF THE INVENTION

In accordance with one aspect of the present invention, a conductive strip detector comprises a capacitor defined by an elongate, electrically conductive element and a laterally spaced, electrically conductive member; and means for monitoring changes in the capacitance of the capacitor when an electrically conductive strip substantially parallel with the element is passed by the capacitor and for indicating when a change in capacitance is due to the presence of an electrically conductive strip.

In contrast to prior art detectors described above, the invention uses a "single-sided" capacitive technique that does not require access to both sides of the document under examination, the use of high voltages, or complex sensing structures.

This enables a simple, small detector to be constructed and, as will be explained below, enables detectors which are almost fully electromagnetically shielded to be constructed of relatively small size thus preventing the generation of large electromagnetic fields around the detector and so permitting further electronic equipment to be positioned near the detector.

Preferably, the monitoring means comprises an electrical circuit connected across the capacitor for generating a high frequency current and means for monitoring the voltage across the capacitor. For example, the electrical circuit can include an oscillator for generating a high frequency, stable signal, an amplifier for amplifying the signal from the oscillator, and means for generating a defined current from the amplifier which is supplied to the capacitor.

The means for monitoring the voltage across the capacitor may have any conventional form but typically includes an amplitude detector whose output is connected to signal processing means which compares the detected amplitude with a threshold set at a level so as to indicate whether or not a conductive strip is in the proximity of the capacitor.

In the preferred example, the detector includes an electrically conductive housing supporting the electrically conductive element and a part of the housing defining the electrically conductive member of the capacitor. This is a particularly convenient construction in that the housing itself defines part of a capacitor while at the same time acting as an electromagnetic shield. In this case, all the high frequency components of the detector can be mounted within the housing which is held at "zero volt" or ground potential considerably reducing the generation of external electromagnetic fields and the effects of conducting objects near the detector.

Typically, the housing includes a relatively small aperture within which the electrically conductive element is supported. The element might be slightly below, substantially level with, or slightly above the adjacent sides of the housing and is generally centrally placed although this is not essential. The gap width is typically in the range of 10–40% of the length of the element.

The electrically conductive element may be made of conductive material of any shape but is preferably metallic and in the form of a relatively long, thin strip which in practice allows efficient capacitive coupling to a conductive strip. In some cases, the electrically conductive element can be in the form of a single piece of wire but preferably comprises a metallic (for example copper) track provided on a printed circuit board. In this case, the printed circuit board preferably also supports the other electronic components of the detector.

In some applications, the detector can be used in security document handling apparatus, for example banknote sorting or processing apparatus, to detect the presence of a metallic thread in security documents as they pass the detector. In other cases, the detector may be in the form of a hand held device which can be swiped across a document to be examined. This latter aspect is most easily achieved when the detector includes a housing of the type described above.

In either case, in the preferred example, a high frequency current is driven through the capacitor and the voltage across it is measured. The presence of a conductive strip such as a thread causes a change in the capacitance and so in the measured voltage. This voltage change is then analyzed.

One of the advantages of the invention is that the use of a single elongate, electrically conductive element enhances the detection capability of the detector. Thus, the elongate element preferably has a dimension in the direction of movement of the thread which is substantially similar to or smaller than the thread dimension in that direction.

Further, in accordance with a second aspect of the present invention, a method of detecting an electrically conductive strip using a detector according to the first aspect of the invention comprises passing an electrically conductive strip by the capacitor, the dimensions of the element in the direction of movement of the strip relative to the capacitor being substantially similar to or smaller than that of the strip; monitoring changes in the capacitance of the capacitor; and indicating the presence of an electrically conductive strip if the change in capacitance satisfies predetermined conditions.

For example, the predetermined conditions could be defined by a threshold which is exceeded by a change in capacitance due to the passage of a metallic thread.

BRIEF DESCRIPTION OF THE DRAWINGS

An example of a detector according to the invention will now be described with reference to the accompanying drawings, in which.

DETAILED DESCRIPTION OF AN EMBODIMENT

Figure 1:
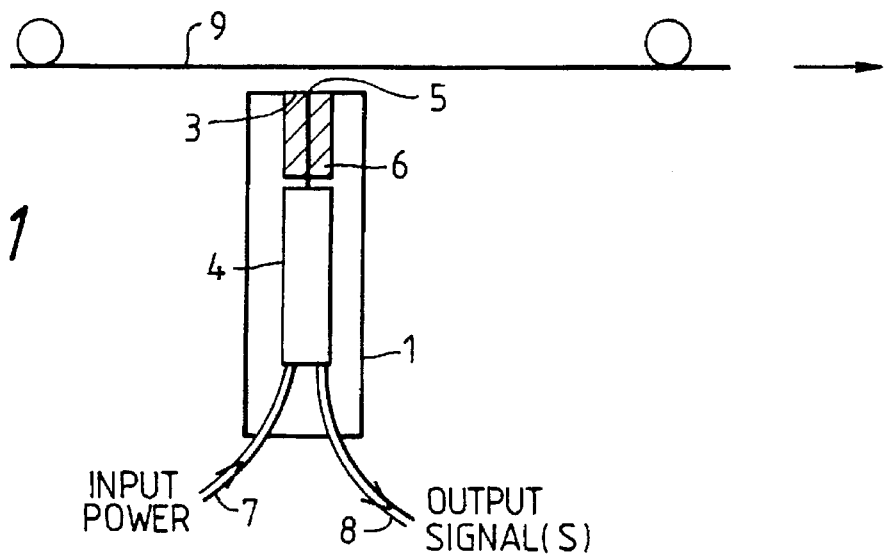
FIG. 1 is a schematic longitudinal section through the detector and illustrating part of a banknote transport system.

The detector shown in FIG. 1 comprises a metallic case or housing 1 held at ground potential terminating in an elongate aperture 3. Within the housing is supported a printed circuit board (PCB) 4 which is electrically coupled, as will be explained below, to an elongate sensing element 5 in the aperture 3 and supported by an insulating member 6. Power for the PCB 4 is supplied along lines 7 and output signals from the PCB 4 are supplied along lines 8.

In use, the detector is mounted in, in this example, banknote sorting apparatus in which banknotes are carried by belts 9 past the sensing element 5 which detects whether or not each banknote includes a metallic thread.

Figure 2:
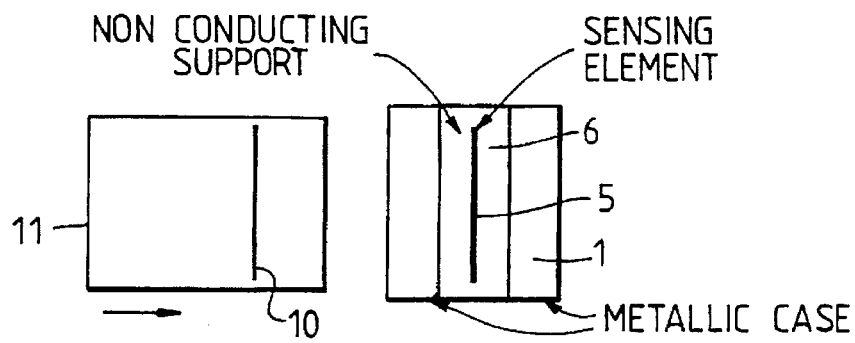
FIG. 2 is a schematic plan view of the detector.

As can be seen in FIG. 2, for the purposes of thread detection, the sensing element 5 is long and thin and oriented so that its longer axis is substantially parallel to the thread 10 of a banknote 11.

Figure 3:
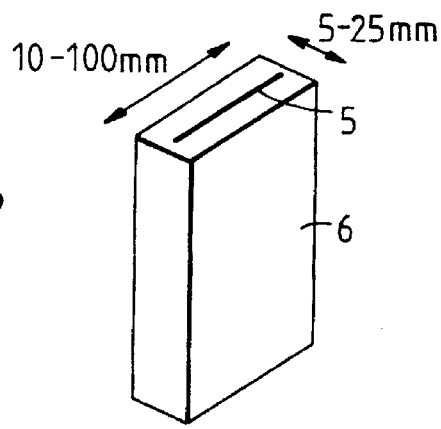
FIG. 3 is a schematic, perspective view of part of the detector.

FIG. 3 shows the mounting of the sensing element 5 in more detail. The dimensions of the sensing element 5 are chosen to be similar to those of the thread to be detected. Typically the length of the sensing element is between 10 and 100 mm and the width of the sensing element is typically in the range 25–100 microns if it is a printed circuit track and 50–500 microns if it is a piece of wire. Typically, the dimension of the external case normal to the thread (i.e. parallel to the direction of travel of the document) is 5 to 25 mm.

Figure 4:
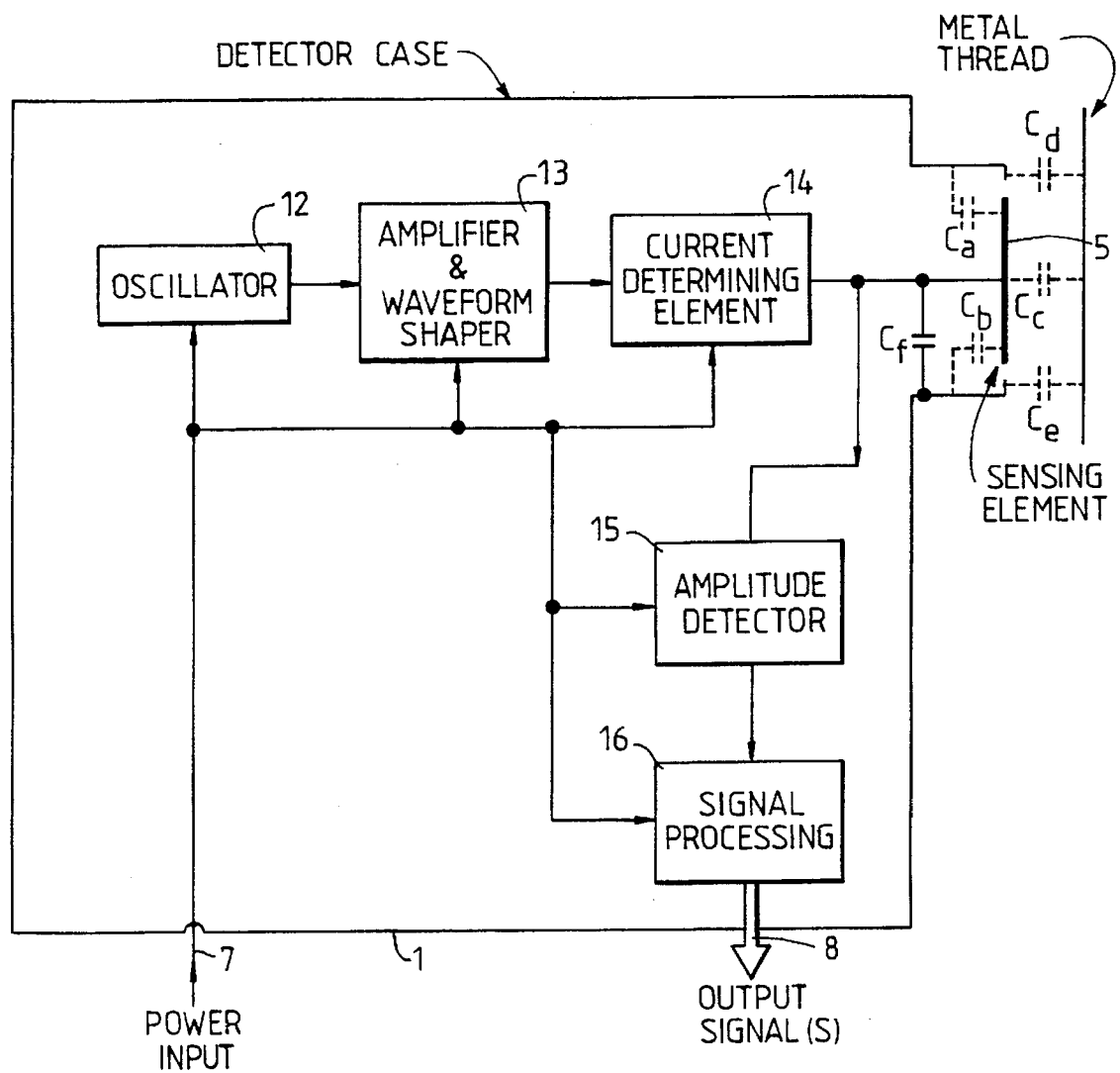
FIG. 4 is a block circuit diagram of the detector processing circuit.

The circuitry mounted on the PCB 4 is shown in more detail in FIG. 4. This includes an oscillator 12 which generates a high frequency AC signal. High frequency stability is required and so a crystal-controlled oscillator is preferred, although other stable types of oscillator, well known to those skilled in the art, may also be used. Typically, the oscillator frequency will be in the range 0.1 to 100 MHz.

The output of the oscillator 12, which is normally at a low signal level, passes to an amplifier 13, which increases the drive level. This amplifier 13 may include components to modify the shape of the drive waveform (e.g. remove the DC component, reduce high frequency components, etc). The amplifier output is connected to the sensing element 5 via a current-determining element 14, and drives a high frequency current through them both.

As noted above, the sensing element 5 is one plate of a capacitor, the other plate of which is the case 1 of the detector. This capacitor is represented on FIG. 4 by capacitors $C_a$ and $C_b$. When a thread is present there is capacitive coupling between the thread and the sensing elements (represented by capacitor $C_c$) and between the thread and the case 1 (represented by capacitors $C_d$ & $C_e$). There may optionally be a (physical) capacitor $C_f$ connected between the case 1 and the sensing element 5. The capacitive coupling to the thread changes the total capacitance at the sensing element. This causes a change in the voltage at this point which in turn causes a change in the output signal of the amplitude detector. This signal is then processed in order to produce at least one output signal.

The current-determining element 14 is chosen so that the voltage change at the sensing element 5 for a given change in capacitance is sufficient for the subsequent processing. A high value resistor or low value capacitor can be used to drive a current which is substantially constant in amplitude. A resonating quartz crystal, matched to that used in the oscillator 12, may be used; this behaves like a resonant circuit, having a high impedance. It is also possible to use an inductor, choosing its value so that the amplitude change is maximised. In all cases, to allow for tolerances in commercially available components, the current determining element, or the capacitor $C_f$, may be made adjustable.

It is important to note that in none of these options is the current-determining element a part of the sensing element. It is mounted internally, not directly affected by, nor directly affecting, external objects.

The voltage across the capacitor is monitored by means of an amplitude detector 15 which may be of any suitable design.

The detected amplitude which represents the magnitude of the voltage across the capacitor plates is fed in the form of an analogue signal to the signal processing circuitry 16 which processes the signal in a conventional manner. Typically, unwanted high frequency signals (arising from the drive waveform, thermal noise, etc, etc) and unwanted low frequency signals (arising from moving mechanical parts, thermal drift, etc, etc) must be highly attenuated, while the signal caused by a thread is not attenuated to any significant degree. The resulting signal is then compared to a threshold level (fixed or variable, according to the application) to produce a binary signal denoting THREAD PRESENT or THREAD NOT PRESENT. This signal may be combined with other signals that correspond to specific parts of the interrogated document to allow only parts of the document to be considered. All of these functions may be achieved using standard electronic processing techniques (low-pass filters, bandpass filters, highpass filters, background level clamps, etc), and may be carried out with analogue or digital techniques, well known to the skilled practitioner.

The output signals on the lines 8, can then be used to control banknote processing apparatus where the detector is mounted in such apparatus or, in the case of a hand-held device, to activate a light or sound generator, typically to indicate the presence of a thread.

Figure 5:
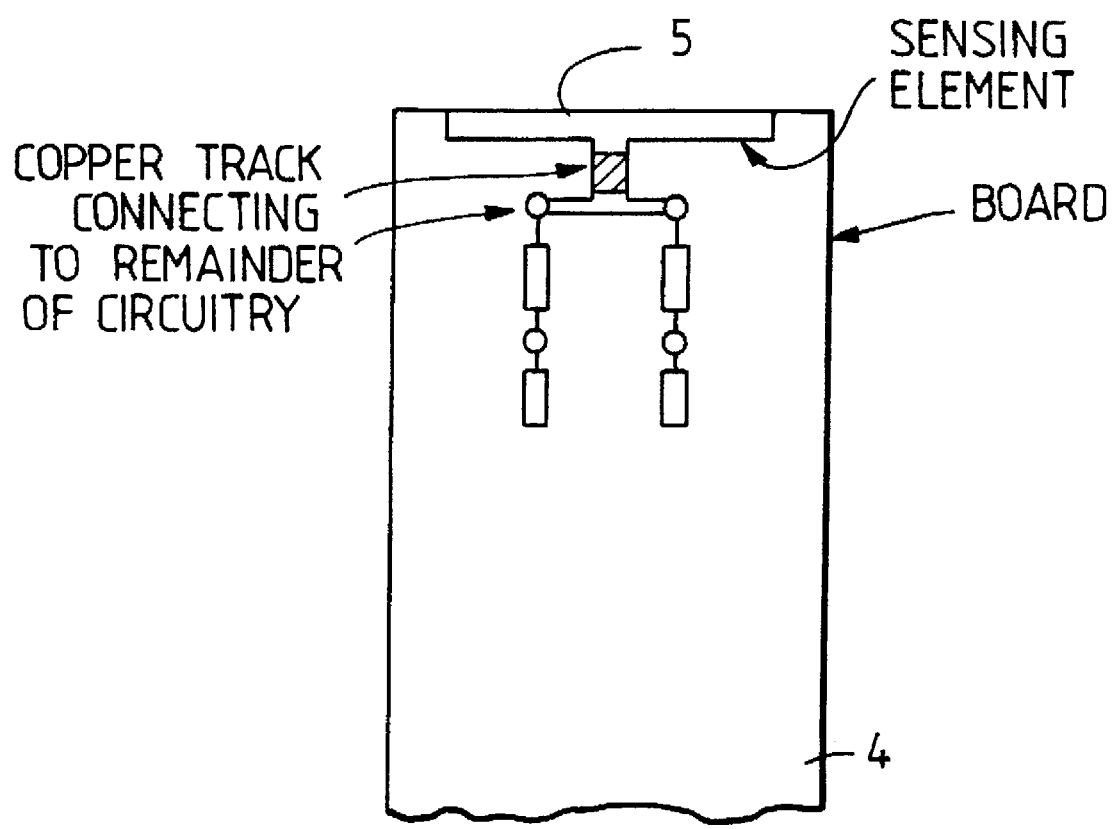
FIG. 5 illustrates an alternative mounting of the sensing element.

As discussed above, the sensing element 5 may be made of conductive material of any shape, but as a relatively long, thin strip allows efficient capacitive coupling to a thread, it is convenient to make the element long and thin. This may be achieved with a single piece of wire, but preferably, a copper track may be made on the same printed circuit board 4 used to mount the remainder of the electronics, using techniques well known to those skilled in the art. In this manner the sensing element 5 may be made at a very low cost. A typical design is shown in FIG. 5. The printed circuit board 4 may be mounted so that the sensing element 5 is either slightly below, substantially level with, or slightly above the sides of the case 1. The space between the end of the printed circuit board and the case is filled with a nonconducting material, e.g. polyester resin.

The advantages of the invention should be self-evident from the above description but can be summarized as follows:

1. The sensing element is a single wire or, preferably, a track on a printed circuit board. This is cheap and easy to manufacture, and is compatible with the techniques normally used in the construction of electronic circuits. Complex guarding structures, essential in some capacitive measurement devices, are not necessary.
2. The detector can be made very small. In the direction of travel, the length of the sensing element can be made less than 1 mm. When the size of the electronic components and the case are included, a length of 5 mm may easily be achieved.
3. With the exception of the aperture for the sensing element, and small entrance holes for power and signal wires, the detector is completely shielded by a metal case. External objects, except those in the immediate vicinity of the sensing element thus have little or no effect on the detector.
4. The electromagnetic shielding given by the case greatly reduces the radiation of electromagnetic fields: the aperture surrounding the sensing element is relatively small, and so electromagnetic radiation will be very low except in the immediate vicinity of the sensing element, so minimising the interference with other, nearby electronic equipment.
5. No high voltages are present in the detector, a typical design of this invention would use voltage supplies in the range 5 to 15 volts, and so the many practical problems associated with the use of high voltages are avoided.
6. The design is such that a multiple element detector is an obvious extension of the technique. A number of elements may be mounted in the same enclosure, sharing the same oscillator and amplifier/waveform shaper, but with individual amplitude detectors and signal processing circuits. This allows more than one part of a document to be interrogated by one detector assembly. A typical embodiment would place the elements in a line "end-to-end", but other arrangements (e.g. a staggered array) are possible.

I claim:

1. A conductive strip detector comprising a housing having front and rear ends and supporting an elongate, electrically conductive element wherein an electrically conductive part of the front end of the housing defines an electrically conductive member, the electrically conductive element and the electrically conductive member being spaced laterally in a first direction, the elongate dimension of the element extending in a second direction, and the first and second directions extending in a plane, the plane being substantially orthogonal to an axis extending between said front and rear ends of said housing; and means disposed in the housing for monitoring changes in the capacitance of a capacitor formed by the housing and the element when an electrically conductive strip is moved in a direction substantially parallel to said plane and past the element and for indicating when the change in capacitance is due to the presence of an electrically conductive strip.

2. A detector according to claim 1, wherein said monitoring means comprises an electrical circuit connected across said capacitor for generating a high frequency current and means for monitoring the voltage across the capacitor and wherein the housing electromagnetically shields the monitoring means.

3. A detector according to claim 2, wherein said electrical circuit includes an oscillator for generating a high frequency, stable signal, an amplifier for amplifying said signal from said oscillator, and means for generating a defined current from said amplifier which is supplied to said capacitor.

4. A detector according to claim 1, further comprising signal processing means, and wherein said means for monitoring the voltage across said capacitor includes an amplitude detector whose output is connected to said signal processing means which compares the detected amplitude with a threshold set at a level so as to indicate whether or not a conductive strip is in the proximity of the capacitor.

5. A detector according to claim 1, wherein said electrically conductive element comprises a track on a printed circuit board.

6. A conductive strip detector according to claim 1 which is adapted to be hand-held.

7. A detector according to claim 1, wherein said conductive element has a dimension in said first direction which is substantially similar to or smaller than the dimension of said electrically conductive strip in the same direction.

8. A detector according to claim 1, wherein said conductive element has a dimension in said first direction in the range 25–100 microns.

9. A detector according to claim 1, wherein said conductive element has a dimension in said first direction in the range 50–500 microns.

10. A detector according to claim 1, wherein said conductive member defines a plane, said electrically conductive element being positioned in substantially the same plane.

11. Security document handling apparatus including a conductive strip detector comprising a housing having front and rear ends supporting an elongate, electrically conductive element wherein an electrically conductive part of the front end of the housing defines an electrically conductive member, the electrically conductive element and the electrically conductive member being spaced laterally in a first direction, the elongate dimension of the element extending in a second direction, and the first and second directions extending in a plane substantially orthogonal one to an axis extending between said front and rear ends of said housing; and means disposed in the housing for monitoring changes in the capacitance of a capacitor formed by the housing and the element when an electrically conductive strip is moved in a direction substantially parallel to said plane and past the element and for indicating when a change in capacitance is due to the presence of an electrically conductive strip, and a document feed system for feeding documents carrying metallic strips past said detector.

12. Security document handling apparatus including a conductive strip detector comprising a housing supporting an elongate, electrically conductive element wherein an electrically conductive part of the housing defines an electrically conductive member, the electrically conductive element and the electrically conductive member being spaced laterally in a first direction; and means disposed in the housing for monitoring changes in the capacitance of a capacitor formed by the housing and the element when an electrically conductive strip is moved in a direction substantially parallel to the first direction and past the element and for indicating when a change in capacitance is due to the presence of an electrically conductive strip, and a document feed system for feeding documents carrying metallic strips past said detector, said feed system feeding documents such that the relative positions of the detector and the document under examination are such that the long axis of the sensing element is substantially parallel to that of the strip, and the relative motion between the strip and the element is substantially normal to this axis.

13. A method of detecting an electronically conductive strip using a conductive strip detector comprising a housing supporting an elongated, electrically conductive element wherein an electrically conductive part of the housing defines an electrically conductive member, the electrically conductive element and the electrically conductive member being spaced laterally in a first direction; and means disposed in the housing for monitoring changes in the capacitance of the electrically conductive member and the electrically conductive element when an electrically conductive strip is moved in a direction substantially parallel with the first direction and past the element and for indicating when a change in capacitance is due to the presence of an electrically conductive strip, the method comprising passing an electrically conductive strip by said electrically conductive element, the long axis of the element being substantially parallel to that of the strip, and the relative motion between the strip and the element being substantially normal to this axis, the dimension of the element along an axis normal to its long axis being substantially the same as or smaller than the dimension of the strip along an axis normal to its long axis; monitoring changes in the capacitance of said capacitor; and indicating the presence of an electrically conductive strip if the change in capacitance satisfies predetermined conditions.

14. A method of detecting according to claim 13, wherein said conductive element has a dimension in said first direction which is substantially similar to or smaller than the dimension of said electrically conductive strip in the same direction.

15. A method of detecting according to claim 13, wherein said conductive element has a dimension in said first direction in the range 25–100 microns.

16. A method of detecting according to claim 13, wherein said conductive element has a dimension in said first direction in the range 50–500 microns.

17. A method of detecting according to claim 13, wherein said conductive member defines a plane, said electrically conductive element being positioned in substantially the same plane.

18. A conductive strip detector for use in detecting conductive threads in documents, which comprises: a housing; a plurality of elongate, electrically conductive elements supported in the housing, the housing having a conductive part defining an electrically conductive member, the electrically conductive elements and the electrically conductive members being spaced laterally in a first direction; and means disposed in the housing for monitoring changes in the capacitances of capacitors formed by the housing and the elements when a document having conductive threads is moved in a direction substantially parallel to the first direction and past the elements and for indicating when changes in the capacitances of the capacitors are due to the presence of metal threads to thereby provide thread detection in a plurality of areas of the document at the same time.

19. A conductive strip detective according to claim 18, wherein said conductive element has a dimension in said first direction which is substantially similar to or smaller than the dimension of said electrically conductive strip in the same direction.

20. A conductive strip detector according to claim 18, wherein said conductive element has a dimension in said first direction in the range 25–100 microns.

21. A conductive strip detector according to claim 18, wherein said conductive element has a dimension in said first direction in the range 50–500 microns.

22. A conductive strip detector according to claim 18, wherein said conductive member defines a plane, said electrically conductive element being positioned in substantially the same plane.

\* \* \* \* \*